(12) United States Patent
Ma et al.

(10) Patent No.: US 9,202,714 B2
(45) Date of Patent: Dec. 1, 2015

(54) METHODS FOR FORMING SEMICONDUCTOR DEVICE PACKAGES

(75) Inventors: Zhaohui Ma, Singapore (SG); Wei Zhou, Singapore (SG); Aibin Yu, Singapore (SG)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 13/454,598

(22) Filed: Apr. 24, 2012

(65) Prior Publication Data
US 2013/0280861 A1 Oct. 24, 2013

(51) Int. Cl.
*H01L 21/56* (2006.01)
*H01L 23/00* (2006.01)

(52) U.S. Cl.
CPC .............. *H01L 21/563* (2013.01); *H01L 24/27* (2013.01); *H01L 24/73* (2013.01); *H01L 24/92* (2013.01); *H01L 24/13* (2013.01); *H01L 24/29* (2013.01); *H01L 24/81* (2013.01); *H01L 24/83* (2013.01); *H01L 2224/1148* (2013.01); *H01L 2224/11845* (2013.01); *H01L 2224/131* (2013.01); *H01L 2224/133* (2013.01); *H01L 2224/1329* (2013.01); *H01L 2224/13083* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/16146* (2013.01); *H01L 2224/16148* (2013.01); *H01L 2224/16238* (2013.01); *H01L 2224/2732* (2013.01); *H01L 2224/27416* (2013.01); *H01L 2224/27436* (2013.01); *H01L 2224/27831* (2013.01); *H01L 2224/27845* (2013.01); *H01L 2224/2919* (2013.01);

(Continued)

(58) Field of Classification Search
CPC ... H01L 21/563; H01L 23/28; H01L 23/3128; H01L 23/3157; H01L 24/10; H01L 24/11; H01L 24/12
USPC .......... 438/118, 127, 758, 760; 257/E23.135, 257/E23.136, E23.116, E23.129
See application file for complete search history.

(56) References Cited

U.S. PATENT DOCUMENTS 5,641,113 A * 6/1997 Somaki et al. ........... 228/180.22
5,953,623 A * 9/1999 Boyko et al. .................. 438/612

(Continued)

OTHER PUBLICATIONS

Nimura et al., Solder/Adhesive Bonding Using Simple Planarization Technique for 3D Integration, 2011 Electronic Components and Technology Conference IEEE 61st, May 31, 2011-Jun. 3, 2011, pp. 1147-1152.

*Primary Examiner* — Michele Fan
(74) *Attorney, Agent, or Firm* — TraskBritt

(57) ABSTRACT

Methods for forming semiconductor device packages include applying an underfill material over a semiconductor wafer including conductive elements such that an average thickness of the underfill material is at least about 80% of an average height of the conductive elements and each conductive element is covered by underfill material. Underfill material covering tips of conductive elements is removed. Other methods include positioning a stencil over a semiconductor wafer and applying an underfill material to a major surface of the semiconductor wafer through the stencil. Additional methods include aligning and associating conductive elements having a surface substantially free of underfill material with bond pads of a substrate, melting and flowing the underfill material, and heating the conductive elements and underfill material to melt tip portions of the conductive elements and cure the underfill material.

20 Claims, 7 Drawing Sheets

(52) U.S. Cl.
CPC ............... *H01L2224/73104* (2013.01); *H01L 2224/75252* (2013.01); *H01L 2224/81191* (2013.01); *H01L 2224/81203* (2013.01); *H01L 2224/81815* (2013.01); *H01L 2224/83191* (2013.01); *H01L 2224/83203* (2013.01); *H01L 2224/83862* (2013.01); *H01L 2224/9205* (2013.01); *H01L 2224/9211* (2013.01); *H01L 2224/94* (2013.01)

(56) References Cited

U.S. PATENT DOCUMENTS

| | | | |
|---|---|---|---|
| 5,956,605 A * | 9/1999 | Akram et al. | 438/613 |
| 5,969,461 A * | 10/1999 | Anderson et al. | 310/313 R |
| 6,063,646 A * | 5/2000 | Okuno et al. | 438/107 |
| 6,118,179 A * | 9/2000 | Farnworth et al. | 257/734 |
| 6,168,972 B1 * | 1/2001 | Wang et al. | 438/108 |
| 6,225,206 B1 * | 5/2001 | Jimarez et al. | 438/616 |
| 6,245,595 B1 | 6/2001 | Nguyen et al. | |
| 6,294,316 B1 * | 9/2001 | Kaneda et al. | 430/314 |
| 6,425,516 B1 * | 7/2002 | Iwatsu et al. | 228/180.22 |
| 6,566,234 B1 | 5/2003 | Capote et al. | |
| 6,791,036 B1 * | 9/2004 | Chen et al. | 174/257 |
| 6,800,946 B2 | 10/2004 | Chason et al. | |
| 6,861,285 B2 | 3/2005 | Dias | |
| 6,916,684 B2 | 7/2005 | Stepniak et al. | |
| 6,916,687 B2 * | 7/2005 | Ho et al. | 438/120 |
| 6,930,390 B2 * | 8/2005 | Kaneda et al. | 257/738 |
| 7,129,581 B2 * | 10/2006 | Ito | 257/758 |
| 7,169,691 B2 * | 1/2007 | Doan | 438/598 |
| 7,170,185 B1 * | 1/2007 | Hogerton et al. | 257/780 |
| 7,176,572 B2 * | 2/2007 | Hanaoka | 257/758 |
| 7,331,106 B2 | 2/2008 | Workman et al. | |
| 7,413,928 B2 * | 8/2008 | Doan | 438/109 |
| 7,482,702 B2 | 1/2009 | Farnworth et al. | |
| 7,578,056 B2 | 8/2009 | Johnson et al. | |
| 7,632,710 B2 | 12/2009 | Sakai et al. | |
| 7,637,412 B2 | 12/2009 | Koopmans | |
| 7,768,125 B2 * | 8/2010 | Chow et al. | 257/738 |
| 2001/0048158 A1 | 12/2001 | Lin | |
| 2002/0089067 A1 * | 7/2002 | Crane et al. | 257/778 |
| 2002/0132463 A1 * | 9/2002 | Urushima | 438/613 |
| 2003/0008133 A1 * | 1/2003 | Paik et al. | 428/332 |
| 2003/0226254 A1 * | 12/2003 | Koning et al. | 29/832 |
| 2004/0187306 A1 * | 9/2004 | Shi | 29/832 |
| 2005/0110164 A1 | 5/2005 | Pendse | |
| 2005/0269700 A1 * | 12/2005 | Farnworth et al. | 257/737 |
| 2005/0277279 A1 * | 12/2005 | Luo et al. | 438/614 |
| 2006/0063305 A1 | 3/2006 | Wei et al. | |
| 2006/0063310 A1 * | 3/2006 | Jadhav et al. | 438/122 |
| 2006/0134901 A1 * | 6/2006 | Chaware et al. | 438/612 |
| 2007/0102827 A1 * | 5/2007 | Hogerton et al. | 257/778 |
| 2008/0290478 A1 * | 11/2008 | Chen | 257/666 |
| 2009/0075429 A1 * | 3/2009 | Sato et al. | 438/118 |
| 2009/0127718 A1 * | 5/2009 | Chen | 257/778 |
| 2009/0142884 A1 * | 6/2009 | Katoh | 438/108 |
| 2009/0250814 A1 | 10/2009 | Pendse et al. | |
| 2010/0003786 A1 | 1/2010 | Feger et al. | |
| 2010/0225434 A1 * | 9/2010 | Wang et al. | 336/200 |
| 2010/0244233 A1 * | 9/2010 | Kim et al. | 257/693 |
| 2011/0233762 A1 | 9/2011 | Gruber et al. | |
| 2011/0309481 A1 * | 12/2011 | Huang et al. | 257/659 |
| 2012/0007228 A1 * | 1/2012 | Lu et al. | 257/692 |
| 2012/0077313 A1 * | 3/2012 | Homma et al. | 438/109 |
| 2012/0104602 A1 * | 5/2012 | Nanba | 257/737 |
| 2012/0178218 A1 * | 7/2012 | Bauer et al. | 438/126 |
| 2012/0208009 A1 * | 8/2012 | Oda et al. | 428/336 |
| 2013/0113118 A1 * | 5/2013 | Kim et al. | 257/782 |

* cited by examiner

METHODS FOR FORMING SEMICONDUCTOR DEVICE PACKAGES

FIELD

Embodiments of the present disclosure relate to methods for forming semiconductor device packages. More specifically, the present disclosure relates to forming electrical interconnections that are uncompromised by entrapped underfill material.

BACKGROUND

In the semiconductor industry, so-called "flip-chips" may be attached to a substrate, such as a printed circuit board (PCB) or another semiconductor die, through an array of conductive bumps, studs, columns or pillars, which may be characterized as conductive elements. A dielectric underfill material may fill a gap between the flip-chip and the substrate. Referring to FIGS. 1A through 2, in a so-called "wafer level underfill" (WLUF) method, an array of conductive elements 12 is formed on a surface of a semiconductor wafer 10 including multiple flip-chips, and dielectric WLUF material 30 is deposited on the surface of the semiconductor wafer 10 after the conductive elements 12 are formed. The WLUF material 30 may be spin-coated or laminated on the surface of the semiconductor wafer 10 with the array of conductive elements 12 formed thereon. In a so-called "overcoated" semiconductor wafer 10, the WLUF material 30 may have an average height that is greater than an average height of the conductive elements 12, as shown in FIG. 1A. In a so-called "undercoated" semiconductor wafer 10, the WLUF material 30 may have an average height that is less than an average height of the conductive elements 12, as shown in FIG. 1B. Regardless of whether the semiconductor wafer 10 is overcoated or undercoated, the WLUF material 30 covers the conductive elements 12 of the array, as shown in FIGS. 1A and 1B.

Referring to FIG. 2, after the WLUF material 30 is deposited over the semiconductor wafer 10, including over the conductive elements 12, the flip-chips of the semiconductor wafer 10 are singulated into individual flip-chips 11. Each flip-chip 11 is then positioned over a substrate 40, with the conductive elements 12 aligned with bond pads 42 of the substrate 40, and attached to the substrate 40, such as by using a thermal compression bonding process. The WLUF material 30 melts and flows responsive to the application of heat during the bonding process to fill the gap between the flip-chip 11 and the substrate 40, and the WLUF material 30 is cured. Ideally, the melted WLUF material 30 flows off of each conductive element 12 to enable an electrical connection to be made between the conductive elements 12 and the bond pads 42. However, a portion of the WLUF material 30 often does not flow off some of the conductive elements 12 and becomes entrapped between an end of a conductive element 12 and its corresponding bond pad 42, as shown in FIG. 2 at reference numeral 32. The entrapped WLUF material 32 may increase electrical resistance across the electrical connection or cause the electrical connection to fail. Even a small amount of entrapped WLUF material 32 may result in weakened bond joint integrity, which may result in early failure of the device. Such defects may lower the performance of a device including the flip-chip 11 and the substrate 40, or may even render the entire device useless. However, use of the WLUF method enables application of the underfill material to the entire semiconductor wafer 10, which saves time and cost of manufacturing over methods that provide underfill material in a gap under individual flip-chips.

In a so-called "capillary underfill" (CUF) method, the flip-chips are individually placed over the substrate such that the conductive elements are in contact with bond pads of the substrate, and a bond joint between the conductive elements and bond pads is established. Liquid, relatively low-viscosity dielectric underfill material is then introduced into a gap between the flip-chip and the substrate along one or more edges of the substrate and the flip-chip and is drawn into the gap by wetting of the substrate and flip-chip surfaces and capillary attraction. The CUF method enables the electrical connections between the conductive bumps or pillars of the flip-chip and the bond pads of the substrate to be free of underfill material, which improves the electrical connections and performance thereof. However, introducing the underfill material into the gaps individually increases the time and cost of manufacturing compared to the WLUF method. Furthermore, as flip-chips and their respective conductive bumps or pillars are reduced in size, according to the well-known trend in the semiconductor industry, it is becoming increasingly difficult to fill in the gap between the flip-chips and their associated substrates without the formation of voids in the underfill material. When present, voids in the underfill material may decrease the reliability, performance, and physical stability of devices formed with the flip-chips and their associated substrates.

DETAILED DESCRIPTION

Figure 1A:
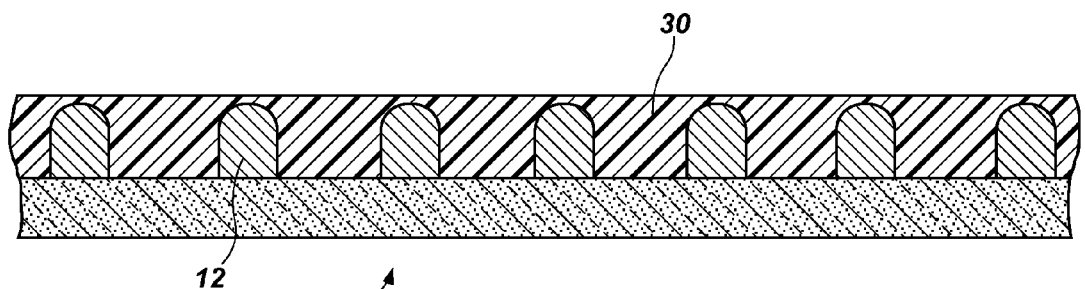
FIG. 1A shows a partial cross-sectional view of a conventional semiconductor die that is overcoated with a wafer level underfill (WLUF) material.
Figure 1B:
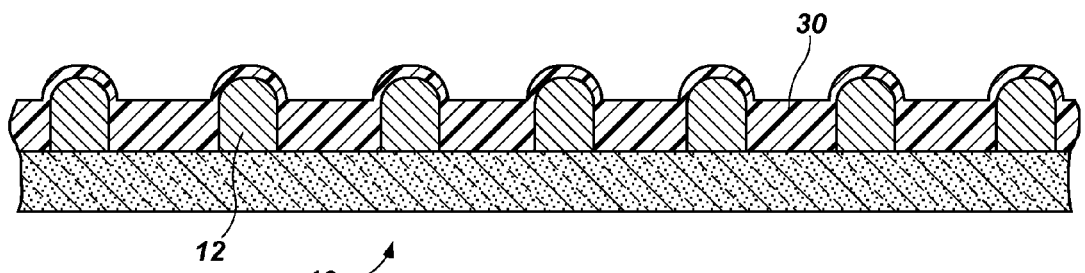
FIG. 1B shows a partial cross-sectional view of a conventional semiconductor die that is undercoated with a WLUF material.
Figure 2:
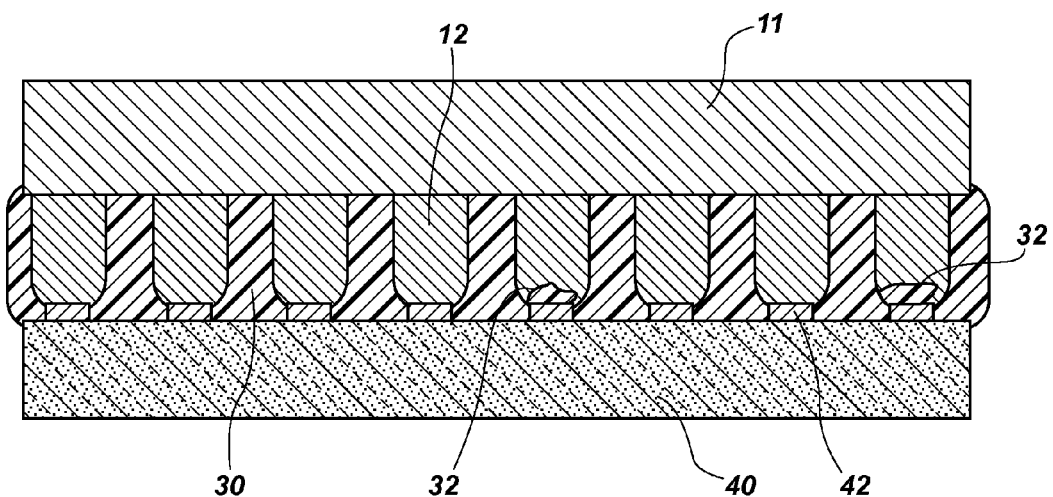
FIG. 2 shows a conventional semiconductor device package formed by connecting either of the semiconductor dice of FIG. 1A or FIG. 1B to a substrate.

The following description provides specific details, such as material types and processing conditions, in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the semiconductor industry.

In addition, the description provided below does not describe a complete process flow for forming semiconductor devices. The methods described below do not necessarily form complete semiconductor devices. The remainder of the process flow and complete semiconductor devices are known to those of ordinary skill in the art. Accordingly, only the methods and devices necessary to understand embodiments of the present disclosure are described in detail herein. Additional acts to form complete semiconductor devices and systems may be performed by conventional fabrication techniques known to those of ordinary skill in the art.

As used herein, any relational term, such as "first," "second," "over," "below," etc., is used for clarity and convenience in understanding the present disclosure and accompanying drawings and does not connote or depend on any specific preference, orientation, or order, except where the context clearly indicates otherwise.

As used herein, the term "substantially" in reference to a given parameter, property, or condition means and includes to a degree that one of ordinary skill in the art would understand that the given parameter, property, or condition is met within a degree of variance, such as within acceptable manufacturing tolerances.

In the following detailed description, reference is made to the accompanying drawings, which form a part of the present disclosure, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, compositional, and electrical changes may be made without departing from the scope of the present disclosure. The illustrations presented herein are not meant to be actual views of any particular system, device, structure, or memory cell, but are merely idealized representations that are employed to describe the embodiments of the present disclosure. The drawings presented herein are not necessarily drawn to scale. Additionally, elements common or similar between drawings may retain the same numerical designation.

The embodiments of the present disclosure include methods for forming a semiconductor device including at least one semiconductor die attached to a substrate. Electrical interconnections between the semiconductor die and the substrate may be provided through a plurality of conductive elements formed over a major surface, such as an active surface or a back side, of the semiconductor die. Underfill material may be applied at the wafer level. By following the methods presently disclosed, each electrical interconnection may be at least substantially free of entrapped underfill material, which, when present, is known to cause defects in the electrical interconnections.

Figure 3:
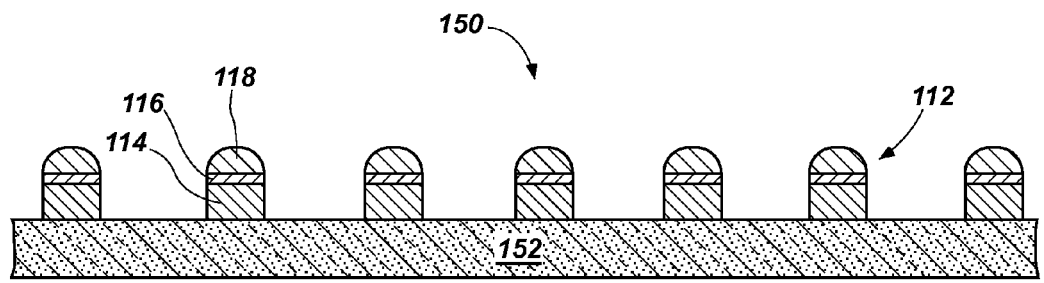
FIG. 3 shows a partial cross-sectional view of an embodiment of a semiconductor wafer including a plurality of conductive elements thereon according to the present disclosure.

FIG. 3 shows a partial cross-sectional view of an embodiment of a semiconductor wafer 150 including a plurality of conductive elements 112 thereon according to the present disclosure. Although only a portion of the semiconductor wafer 150 is shown in FIG. 3 for clarity, the semiconductor wafer 150 may include a plurality of individual semiconductor dice, with each semiconductor die including a plurality of conductive elements 112 formed on a major surface thereof. For simplicity and clarity, seven conductive elements 112 are shown on the semiconductor wafer 150. However, each semiconductor die of the semiconductor wafer 150 may include any number of conductive elements 112 formed thereon. For example, each semiconductor die of the semiconductor wafer 150 may include more than about one thousand conductive elements 112, although the methods and elements of the present disclosure may be used in applications where fewer or more conductive elements 112 are present. So-called "high pin-count" semiconductor dice with a large number of conductive elements relatively close together (e.g., fine pitch) and the use of multiple, stacked semiconductor dice in a package exacerbate problems with conventional underfill techniques referenced above.

The semiconductor wafer 150 of the present disclosure is not limited to any particular semiconductor material. For example, the semiconductor wafer 150 may include a substrate 152 that is silicon-based, germanium-based, silicon-germanium-based, gallium-arsenide-based, indium-gallium-arsenide-based, etc.

The semiconductor wafer 150 may include a plurality of electrical contact points on a major surface thereof. As used herein, the phrase "major surface" means a surface generally parallel to a plane in which an object extends, such as the top surface of the substrate 152 when viewed in the perspective of FIG. 3. By way of example and not limitation, each semiconductor die of the semiconductor wafer 150 may be or be a part of a memory device (e.g., a dynamic random access memory (DRAM) device, a NAND Flash memory device, a static random access memory (SRAM) device, a NOR memory device, etc.), a processor, a logic die, a complementary metal oxide semiconductor (CMOS) image sensor, a so-called "system on a chip" comprising processor, logic and memory, etc. Each semiconductor die of the semiconductor wafer 150 may be a so-called "flip-chip" for physically bonding and electrically connecting to a substrate, as will be explained in more detail below, or may comprise any other semiconductor die employing conductive elements protruding therefrom for connection to one or more other semiconductor dice or to higher level packaging.

The semiconductor wafer 150 may include a plurality of conductive elements 112 thereon that may be operatively connected to integrated circuits (not shown) of the semiconductor wafer 150. For example, the conductive elements 112 may be electrically connected to one or more of transistors, capacitors, diodes, wordlines, bit lines, peripheral circuitry, electronic vias, etc., formed in the substrate 152 of the semiconductor wafer 150. The conductive elements 112 may be formed of any electrically conductive material or combination of electrically conductive materials. By way of example and not limitation, each conductive element 112 may include one or more of copper, nickel, gold, silver, tin, tungsten, platinum, indium, solder (e.g., SnAg), etc. In some embodiments, each conductive element 112 may include, for example, a copper pillar 114 with a nickel cap 116 and a solder portion 118 formed on the nickel cap 116, as shown in FIG. 3. By way of another example, each conductive element 112 may be a copper pillar, a solder bump, a gold stud bump, a conductive epoxy, or a conductor-filled epoxy. However, the present disclosure is not limited to such examples of conductive elements. Rather, each conductive element 112 may include any sufficiently conductive material or combination thereof and have any structural form, as will be understood by one of ordinary skill in the art.

Each conductive element 112 may be formed by conventional techniques, such as, for example, one or more of sputtering, patterning, material removal (e.g., wet etching, dry etching, ablation, etc.), photolithography, chemical vapor deposition, physical vapor deposition, etc. The conductive elements 112 may be sized, configured, and arranged to provide electrical contact points for electrically connecting to bond pads, terminals, or other conductive structures of a substrate, as will be explained in more detail below. In some embodiments, the conductive elements 112 may be so-called "fine pitch" conductive elements. For example, the conductive elements 112 may be placed at a pitch, which may be defined as center-to-center spacing of adjacent conductive elements 112, of about 100 μm or less. In some embodiments, the conductive elements 112 may have a pitch of about 50 μm or less. It is contemplated that conductive elements 112 spaced at a pitch of 40 μm or even 30 μm will be employed in semiconductor devices in the foreseeable future.

Figure 4:
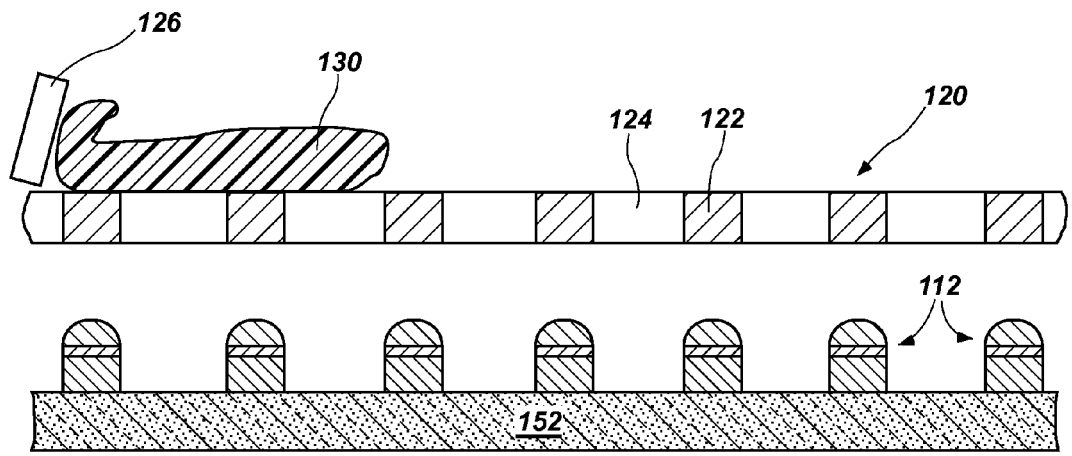
FIG. 4 illustrates a method of applying an underfill material on a semiconductor wafer according to an embodiment of the present disclosure.

FIG. 4 illustrates a method of applying a dielectric underfill material 130 on the semiconductor wafer 150 according to an embodiment of the present disclosure. Referring to FIG. 4, a stencil 120 may be disposed over the semiconductor wafer 150 including the plurality of conductive elements 112 on a major surface thereof, spacing of the stencil 120 above the semiconductor wafer 150 being exaggerated for clarity. The stencil 120 may include a plurality of blocked regions 122 comprising an emulsion and a plurality of open regions 124, which may comprise a large number of apertures through which underfill material 130 may be forced. The plurality of blocked regions 122 may be aligned with the plurality of conductive elements 112 and the plurality of open regions 124 may be aligned with an area between adjacent conductive elements 112. Although the stencil 120 is shown in FIG. 4 as positioned a distance from the plurality of conductive elements 112 of the semiconductor wafer 150, the present disclosure also encompasses methods in which the stencil 120 is positioned in contact with at least some of the plurality of conductive elements 112.

The plurality of blocked regions 122 may inhibit the underfill material 130 from passing therethrough, while the plurality of open regions 124 may allow underfill material 130 to pass therethrough. The stencil 120 may be formed of, for example, one or more of a polymer material, a ceramic material (e.g., glass), a metal material, and a fibrous material (e.g., a silk screen). Although referred to as "open," the plurality of open regions 124 may be porous, comprise a screen material, or otherwise comprise a structure extending between the blocked regions 122. Thus, some material of the stencil 120 may be present in the plurality of open regions 124, as long as the plurality of open regions 124 is pervious to the underfill material 130.

As shown in FIG. 4, a volume of the underfill material 130 may be placed over the stencil 120 and passed through the open regions 124 to an area of the substrate 152 of the semiconductor wafer 150 between the conductive elements 112. For example, a squeegee blade 126 may be used to press the underfill material 130 through the stencil 120. The plurality of blocked regions 122 may cover the plurality of conductive elements 112 and, therefore, enable tips of the plurality of conductive elements 112 to be at least partially exposed (i.e., free of the underfill material 130) after the underfill material 130 is formed on the substrate 152 (FIG. 5).

The underfill material 130 may be any dielectric underfill material that has an appropriate viscosity to be passed through the stencil 120 and to remain on the semiconductor wafer 150 after being applied, as will be recognized by one of ordinary skill in the art. For example, the underfill material 130 may be or include one or more of a polymer material, a prepolymer material, a polyimide material, a silicone material (e.g., an organopolysiloxane material), an epoxy material, a resin material (e.g., a thermal plastic resin material), a curing agent (i.e., a hardener), a catalyst (i.e., an accelerator), a filler material (e.g., silica, alumina, boron nitride, etc.), a fluxing agent, a coupling agent, and a surfactant. One of ordinary skill in the art will be capable of choosing an appropriate underfill material 130 in a given application of the present disclosure.

Figure 5:
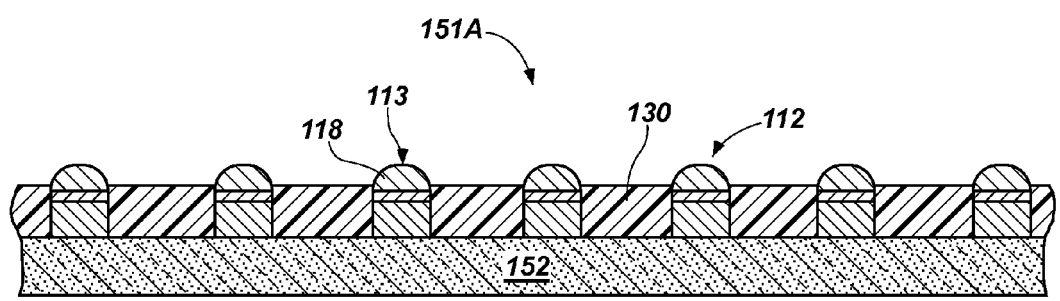
FIG. 5 shows a partial cross-sectional view of an embodiment of a semiconductor wafer formed by the method of FIG. 4.

FIG. 5 shows a partial cross-sectional view of an embodiment of a semiconductor wafer 151A formed by the method of FIG. 4. After the underfill material 130 is formed on the substrate 152 between the plurality of conductive elements 112, the underfill material 130 may be subjected to an elevated temperature to at least partially cure the underfill material 130. For example, the underfill material 130 may be at least partially cured to an at least semi-solid stage, but the underfill material 130 may still be able to be re-melted or further cured with subsequent heating. For example, an underfill material 130 comprising an epoxy may be cured to a tacky, so-called "B-stage" by subjecting the underfill material 130 to a temperature that is dependent on the type of underfill material 130 used, as will be appreciated by one of ordinary skill in the art. After at least partially curing, the underfill material 130 may be sufficiently physically stable at room temperature to remain on the surface of the substrate 152 of the semiconductor wafer 151A between the plurality of conductive elements 112 during subsequent operations, such as during a wafer dicing operation, wherein individual semiconductor dice are singulated by dicing through the underfill material 130 and the substrate 152, and/or during a pick-and-place operation, wherein a semiconductor die singulated from the semiconductor wafer 150 is lifted from the wafer and placed on another semiconductor die, interposer, or other substrate. The underfill material 130 may at least substantially cover the semiconductor wafer 151A between the plurality of conductive elements 112, but each conductive element 112 may have a tip portion with an at least partially exposed surface 113 that is free of the underfill material 130. For example, the at least partially exposed surface 113 may be a surface of the solder portion 118 of each conductive element 112.

Figure 6:
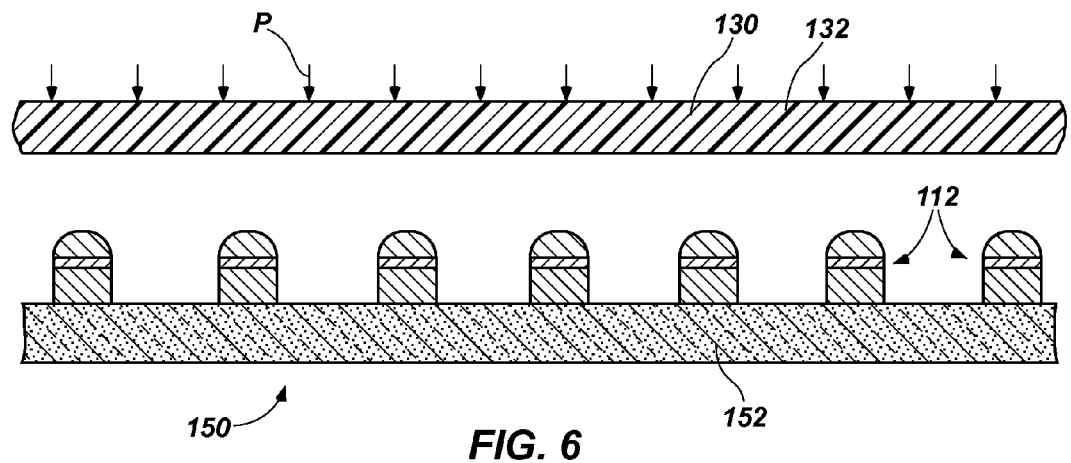
FIG. 6 illustrates a method of applying an underfill material on a semiconductor wafer according to another embodiment of the present disclosure.

FIG. 6 illustrates a method of applying a dielectric underfill material 130 on the semiconductor wafer 150 according to another embodiment of the present disclosure. As shown in FIG. 6, the underfill material 130 may be laminated onto the semiconductor wafer 150. A sheet 132 of underfill material 130 may be disposed over the semiconductor wafer 150. The sheet 132 may be pressed against the semiconductor wafer 150, as shown by the pressure arrows P in FIG. 6, to apply the underfill material 130 to the substrate 152 of the semiconductor wafer 150. In some embodiments, an area between the sheet 132 and the semiconductor wafer 150 may be subjected to a reduced pressure (e.g., a vacuum) to at least substantially remove voids between the sheet 132 and the semiconductor wafer 150. The underfill material 130 of the sheet 132 may be sufficiently pliable to deform around the plurality of conductive elements 112 when subjected to the pressure P. However, at least some underfill material 130 may remain over the conductive elements 112, as shown in FIGS. 7 and 8.

Figure 7:
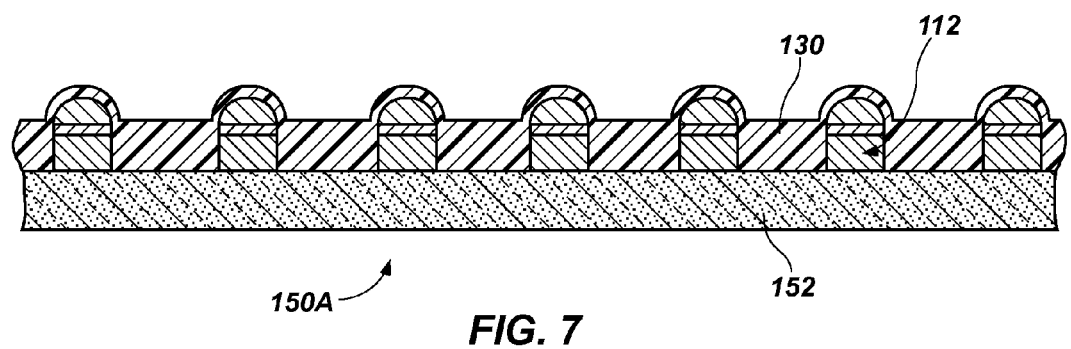
FIG. 7 shows a partial cross-sectional view of an embodiment of a semiconductor wafer that is undercoated with an underfill material according to the present disclosure.

FIG. 7 shows a partial cross-sectional view of an embodiment of a semiconductor wafer 150A that is undercoated with the underfill material 130 according to the present disclosure. Referring to FIG. 6 in conjunction with FIG. 7, the sheet 132 may be selected to have a thickness such that an average thickness of the underfill material 130 on the substrate 152 is less than an average height of the plurality of conductive elements 112. By way of example and not limitation, the average thickness of the underfill material 130 on the substrate 152 of the semiconductor wafer 150A may be at least about eighty percent (80%) of the average height of the plurality of conductive elements 112. In some embodiments, the average thickness of the underfill material 130 may be between about ninety percent (90%) and about ninety-five percent (95%) of the average height of the plurality of conductive elements 112. Thus, after applying pressure to the sheet 132 and the semiconductor wafer 150, the semiconductor wafer 150A may be undercoated with the underfill material 130. However, at least some of the underfill material 130 may remain over the conductive elements 112 of the undercoated semiconductor wafer 150A, as shown in FIG. 7. The underfill material 130 may provide physical support to the plurality of conductive elements 112 in a subsequent planarization operation, as will be explained in more detail below.

Figure 8:
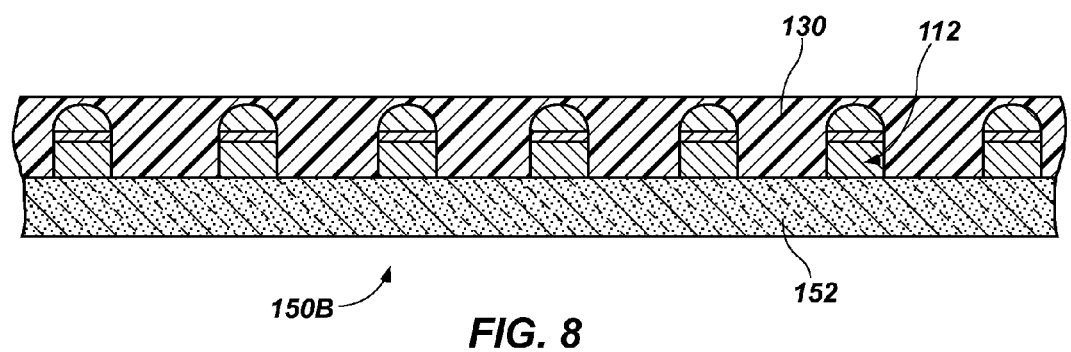
FIG. 8 shows a partial cross-sectional view of an embodiment of a semiconductor wafer that is overcoated with an underfill material according to the present disclosure.

FIG. 8 shows a partial cross-sectional view of an embodiment of a semiconductor wafer 150B that is overcoated with a dielectric underfill material 130 according to the present disclosure. Referring to FIG. 6 in conjunction with FIG. 8, the sheet 132 may be selected to have a thickness such that an average thickness of the under-fill material 130 on the substrate 152 of the semiconductor wafer 150B is more than an average height of the plurality of conductive elements 112. Thus, after applying pressure P to the sheet 132 and the semiconductor wafer 150, the semiconductor wafer 150B may be overcoated with the underfill material 130. The conductive elements 112 of the overcoated semiconductor wafer 150B may, thus, be covered by at least a portion of the underfill material 130, as shown in FIG. 8.

Regardless of whether the semiconductor wafer is undercoated (as shown by the undercoated semiconductor wafer 150A in FIG. 7) or overcoated (as shown by the overcoated semiconductor wafer 150B in FIG. 8), at least a substantial number of the conductive elements 112 may be covered by the underfill material 130. In some embodiments, each of the conductive elements 112 may be covered by the underfill material 130.

Figure 9:
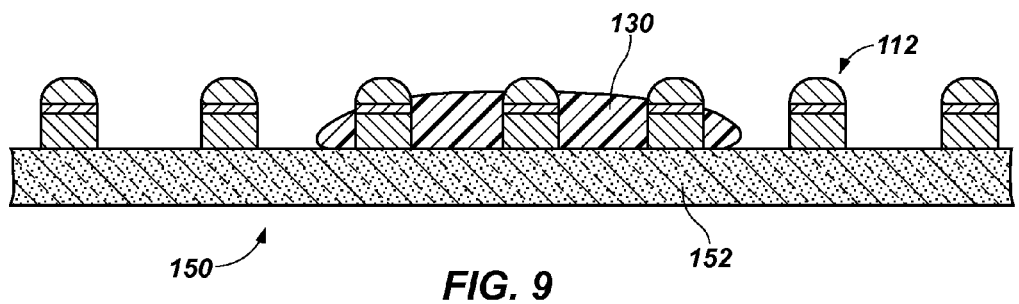
FIG. 9 illustrates a method of applying an underfill material on a semiconductor wafer according to another embodiment of the present disclosure.

FIG. 9 illustrates a method of applying a dielectric underfill material 130 on the semiconductor wafer 150 according to another embodiment of the present disclosure. As shown in FIG. 9, the underfill material 130 may be spin-coated on to the semiconductor wafer 150. An at least semi-liquid (e.g., flowable) underfill material 130 may be disposed over the substrate 152 of the semiconductor wafer 150. The semiconductor wafer 150 may be rotated (not shown) to distribute the underfill material 130 over a major surface of the substrate 152. At least some of the plurality of conductive elements 112 may be covered by the underfill material 130 after the application of the underfill material 130 to the substrate 152, as shown in one of FIGS. 7 and 8. Depending on the volume of underfill material 130 used in the embodiment of FIG. 9, the semiconductor wafer 150 may be undercoated with the underfill material 130, as shown by the undercoated semiconductor wafer 150A of FIG. 7, or overcoated with the underfill material 130, as shown by the overcoated semiconductor wafer 150B of FIG. 8. In some embodiments, the underfill material 130 of a suitable formulation may be subjected to an elevated temperature such as to at least partially cure the underfill material 130, such as to the tacky so-called "B-stage," as described above.

Figure 10:
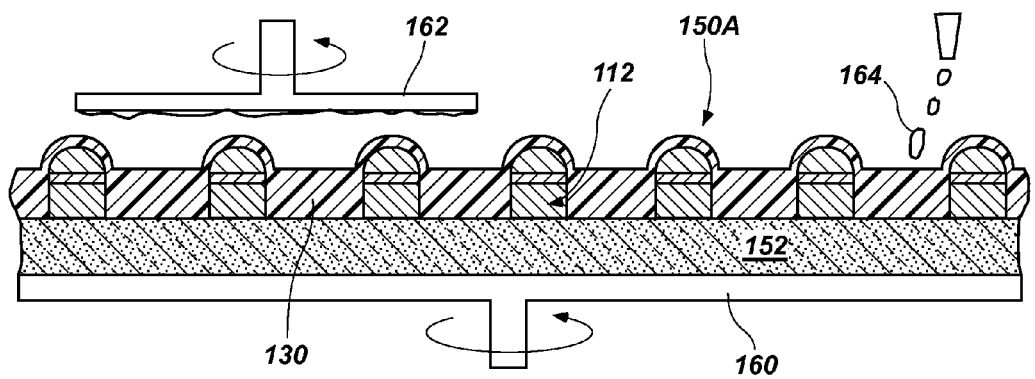
FIG. 10 illustrates a method of removing underfill material from conductive elements on an undercoated semiconductor wafer according to an embodiment of the present disclosure.
Figure 11:
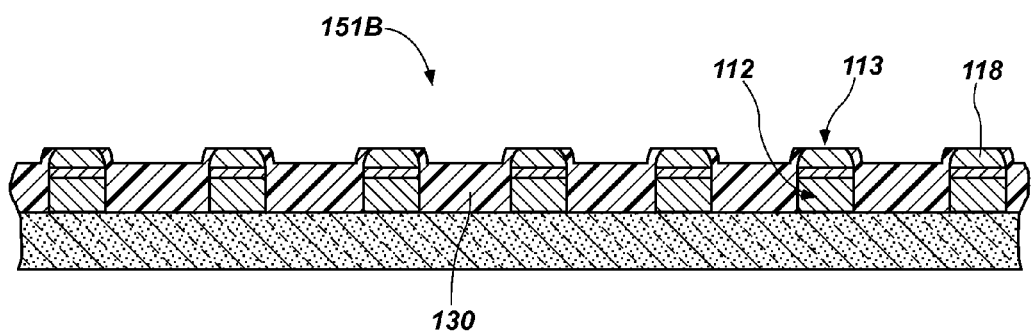
FIG. 11 shows a partial cross-sectional view of an embodiment of a semiconductor wafer formed by the method of FIG. 10.

FIG. 10 illustrates a method of removing underfill material 130 from over the conductive elements 112 on the undercoated semiconductor wafer 150A according to an embodiment of the present disclosure. FIG. 11 shows a partial cross-sectional view of an embodiment of a semiconductor wafer 151B formed by the method of FIG. 10. Referring to FIG. 10 in conjunction with FIG. 11, the undercoated semiconductor wafer 150A including the underfill material 130 may be positioned on a carrier 160 and subjected to a non-selective planarization operation, such as abrasive planarization, including chemical-mechanical planarization (CMP). For example, the carrier 160 may be rotated and a polishing pad 162 may be rotated and pressed against the underfill material 130 over the conductive elements 112 to remove at least a portion of the underfill material 130. By way of example and not limitation, the polishing pad 162 may be relatively soft to conform to the shape of the surface of the underfill material 130 over the conductive elements 112. A polishing slurry 164 may be applied between the underfill material 130 and the polishing pad 162, as is known in the art. The polishing slurry 164 may include abrasive particles dispersed in a liquid, such as, for example, at least one of alumina particles (e.g., fumed alumina, alpha alumina), silica particles (e.g., fumed silica, colloidal silica), silicon carbide particles, and diamond particles, or mixtures of two or more of the aforementioned particles, dispersed in deionized water.

The undercoated semiconductor wafer 150A may be planarized until sufficient underfill material 130 over a tip of each conductive element 112 is removed to at least partially expose a surface 113 of each conductive element 112, as shown in FIG. 11. In some embodiments, the exposed surface 113 may be a surface of the solder portion 118 of the conductive element 112. By way of example and not limitation, the planarization operation may be performed until a thickness of about 2 µm of underfill material 130 is removed from each conductive element 112. However, the amount of material removed will be at least partially dependent on the thickness of the underfill material 130 initially covering each conductive element 112, which, in turn, may be dependent on the type and volume of underfill material 130 used, and on the method used to apply the underfill material 130 over the substrate 152. The planarization operation may be non-selective and, therefore, may remove a portion of each conductive element 112 (e.g., a portion of the solder portion 118) and at least partially planarize each conductive element 112 in addition to removing the underfill material 130, as shown in FIG. 11. Optionally, the semiconductor wafer 151B formed by this method may be cleaned to remove particles and/or other contaminants induced during the planarization operation.

The semiconductor wafer 150A may include a sufficient amount of underfill material 130 over the surface thereof to provide physical support to the plurality of conductive elements 112 during the planarization operation. Although conductive elements 112 of any size may fail mechanically when subjected to a planarization operation, relatively smaller conductive elements 112 (e.g., so-called "fine pitch" conductive elements) may be particularly susceptible to toppling or other mechanical failure initiated by contact with a polishing pad and slurry. Thus, in some embodiments, the physical support provided by the underfill material 130 covering the semiconductor wafer 150A between adjacent conductive elements 112 may inhibit toppling or other mechanical failure of the conductive elements 112 when subjected to the planarization operation.

Figure 12:
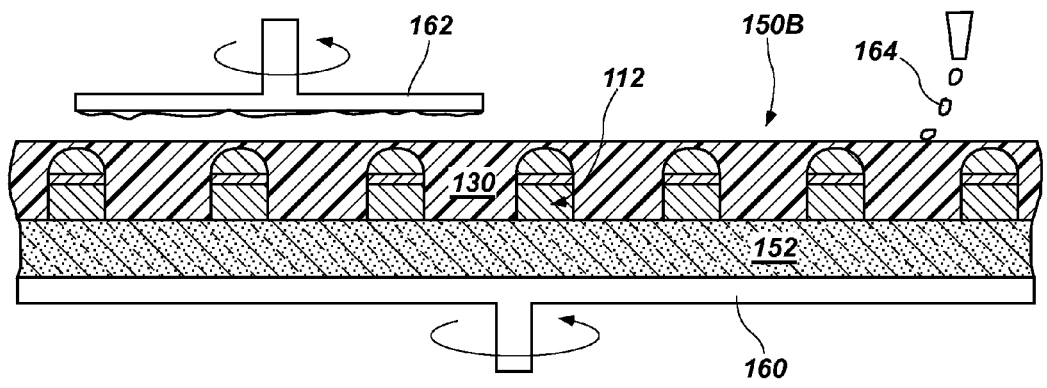
FIG. 12 illustrates a method of removing underfill material from conductive elements on an overcoated semiconductor wafer according to an embodiment of the present disclosure.
Figure 13:
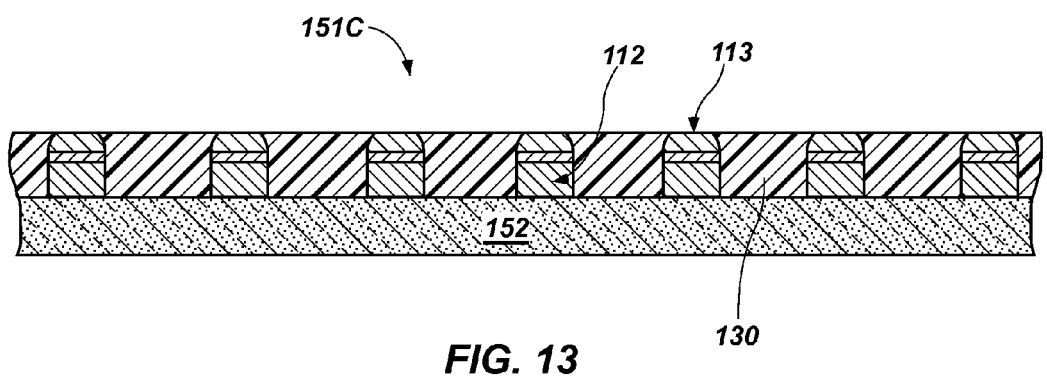
FIG. 13 shows a partial cross-sectional view of an embodiment of a semiconductor wafer formed by the method of FIG. 12.

FIG. 12 illustrates a method of removing a portion of the underfill material 130 from over the conductive elements 112 on the overcoated semiconductor wafer 150B according to an embodiment of the present disclosure. FIG. 13 shows a partial cross-sectional view of an embodiment of the semiconductor wafer 151C formed by the method of FIG. 12. As shown in FIGS. 12 and 13, the overcoated semiconductor wafer 150B may be subjected to a planarization operation, such as CMP, to remove a portion of the underfill material 130 from over the conductive elements 112 and to expose the surface 113 of each conductive element 112 to form a semiconductor wafer 151C having conductive elements 112 with exposed surfaces 113. The underfill material 130 may be removed from over the tips of the conductive elements 112 without reducing the average thickness of the underfill material 130 to less than about eighty percent (80%) of the average height of the conductive elements 112 prior to application of the underfill material 130 over the semiconductor wafer 150. The planarization operation may include positioning the semiconductor wafer 150B on the carrier 160, rotating the carrier 160, rotating the polishing pad 162, disposing the polishing slurry 164 between the polishing pad 162 and the semiconductor wafer 150B, and pressing the polishing pad 162 against the semiconductor wafer 150B, essentially as described above with reference to FIG. 10. However, one of ordinary skill in the art will recognize that particular parameters (e.g., pressure, abrasive particle selection, rotational speed, etc.) of the planarization operation may be adjusted compared to the embodiment of FIG. 10, due to the increased surface area and amount of material to be removed from the overcoated semiconductor wafer 150B when compared to the undercoated semiconductor wafer 150A. Optionally, the semiconductor wafer 151C formed by this method may be cleaned to remove particles and/or other contaminants induced during the planarization operation.

Although the polishing pads 162 of FIGS. 10 and 12 are shown smaller than the semiconductor wafers 150A and 150B for simplicity and clarity, it is to be understood that the drawings are not necessarily drawn to scale, and the polishing pad 162 may be the same diameter or larger than the semiconductor wafers 150A and 150B, as is known in the art of CMP. Furthermore, the relative positions of the polishing pad 162 and the carrier 160 may be switched, i.e., the polishing pad 162 may be located below the carrier 160 and the semiconductor wafers 150A and 150B and the associated carrier 160 may be inverted compared to the perspectives of FIGS. 10 and 12.

Figure 14:
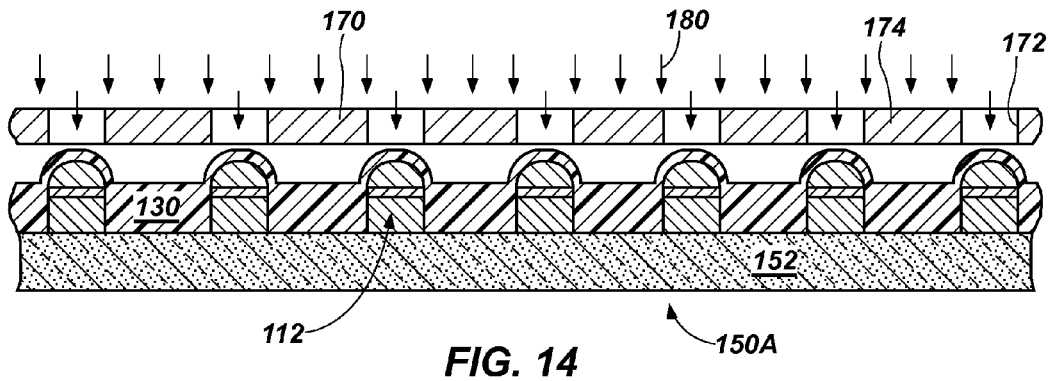
FIG. 14 illustrates a method of removing underfill material from conductive elements on an undercoated semiconductor wafer according to another embodiment of the present disclosure.
Figure 15:
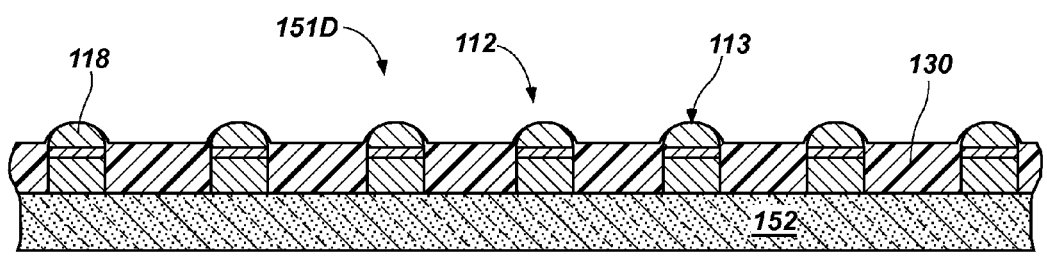
FIG. 15 shows a partial cross-sectional view of an embodiment of a semiconductor wafer formed by the method of FIG. 14.

FIG. 14 illustrates a method of removing the underfill material 130 from over the conductive elements 112 on the undercoated semiconductor wafer 150A according to another embodiment of the present disclosure. FIG. 15 shows a partial cross-sectional view of an embodiment of a semiconductor wafer 151D formed by the method of FIG. 14. Referring to FIG. 14, a mask 170 may be positioned over the semiconductor wafer 150A. The mask 170 may include an aperture 172 corresponding to each conductive element 112 from which the underfill material 130 is to be removed. The underfill material 130 over the substrate 152 of the semiconductor wafer 150A and between the conductive elements 112 may be covered by blocked regions 174 of the mask 170. As shown in FIG. 14, the mask 170 may be positioned proximate or in contact with the semiconductor wafer 150A. Referring to FIG. 14, in conjunction with FIG. 15, a plasma 180, depicted as arrows, may be directed through the apertures 172 in the mask 170 to react with the underfill material 130 covering the conductive elements 112 to remove the underfill material 130 from over tips of the conductive elements 112. In some embodiments, the plasma 180 may be formulated and applied to selectively remove the underfill material 130 while not removing the material of the conductive elements 112, such as the solder portions 118. By way of example and not limitation, the plasma 180 may include at least one of argon, oxygen, nitrogen, hydrogen, tetra fluorocarbon ($CF_4$), and other reactive gases, or a mixture thereof. Thus, the semiconductor wafer 151D may include a plurality of conductive elements 112 that each have a surface 113 exposed through the underfill material 130. Due to the selectivity of the plasma 180, each exposed surface 113 of the conductive elements 112 may, in some embodiments, be curved.

Figure 16:
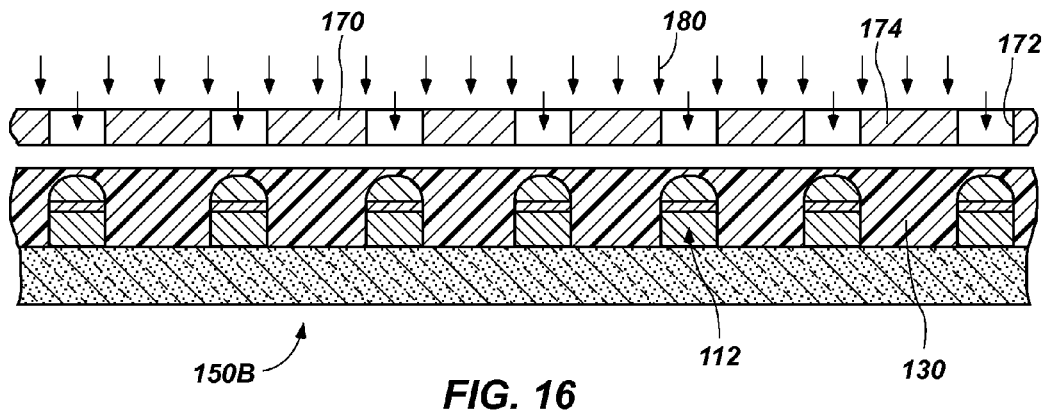
FIG. 16 illustrates a method of removing underfill material from conductive elements on an overcoated semiconductor wafer according to another embodiment of the present disclosure.
Figure 17:
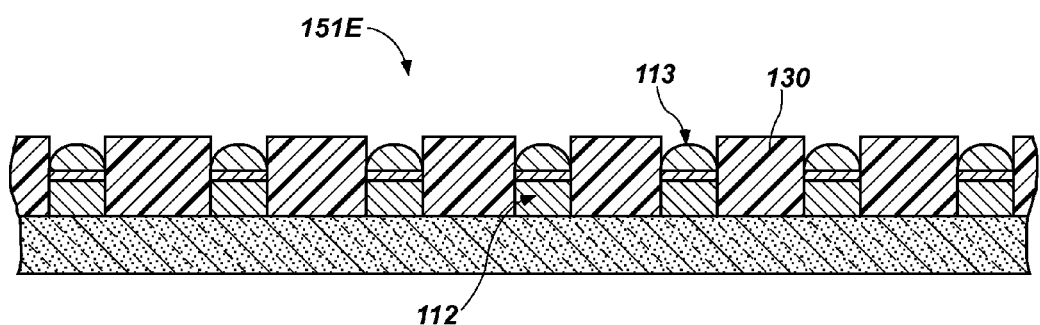
FIG. 17 shows a partial cross-sectional view of an embodiment of a semiconductor wafer formed by the method of FIG. 16.

FIG. 16 illustrates a method of removing the underfill material 130 from over the conductive elements 112 on the overcoated semiconductor wafer 150B according to another embodiment of the present disclosure. FIG. 17 shows a partial cross-sectional view of an embodiment of a semiconductor wafer 151E formed by the method of FIG. 16. As shown in FIG. 16, the underfill material 130 may be removed from over the conductive elements 112 in essentially the same manner described above with reference to FIG. 14. The mask 170 may be positioned over the overcoated semiconductor wafer 150B with the apertures 172 thereof positioned over the conductive elements 112. The blocked regions 174 of the mask 170 may be positioned over the underfill material 130 between the conductive elements 112. The plasma 180, depicted as arrows, may be directed through the apertures 172 in the mask 170 to react with and remove the under-fill material 130 covering tips of the conductive elements 112. As shown in FIG. 17, the semiconductor wafer 151E may include the plurality of conductive elements 112 each having the surface 113 thereof exposed through the underfill material 130. In some embodiments, the plasma 180 may selectively remove the underfill material 130 while the conductive element 112 is not removed, such that the exposed surface 113 of the conductive element 112 may be curved.

Figure 18:
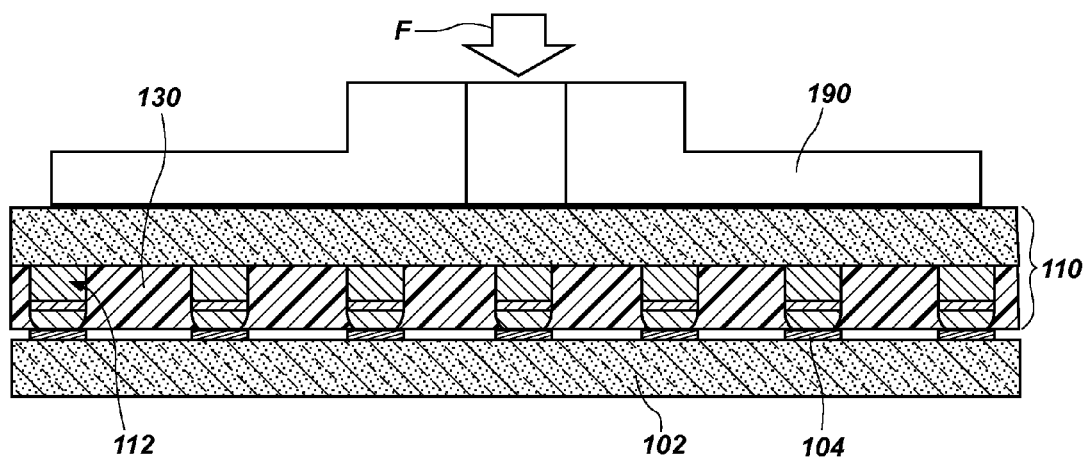
FIGS. 18 and 19 illustrate a method of bonding a semiconductor die to a substrate according to an embodiment of the present disclosure.
Figure 19:
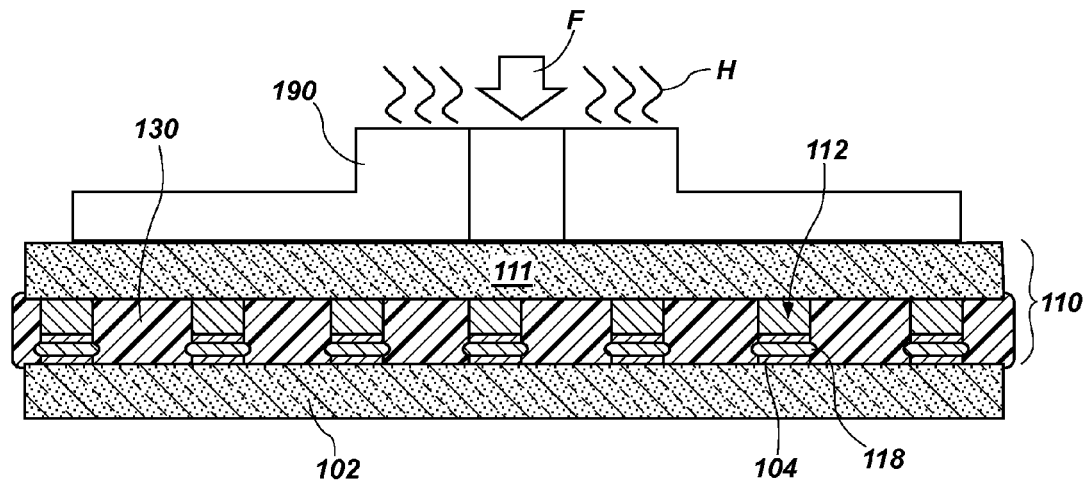

FIGS. 18 and 19 illustrate a method of attaching a semiconductor die 110 to a substrate 102 according to an embodiment of the present disclosure. Any of the semiconductor wafers 151A, 151B, 151C, 151D, or 151E described above with reference to FIGS. 5, 11, 13, 15, and 17, respectively, may be diced to form a plurality of individual semiconductor dice 110, each having a plurality of conductive elements 112 exposed through the underfill material 130, as described above. A semiconductor die 110 of the plurality of semiconductor dice 110 may be positioned over a substrate 102 having a plurality of bond pads 104 formed on a major surface thereof. The conductive elements 112 of each semiconductor die 110 may be aligned with the bond pads 104. The bond pads 104 may be formed in a pattern corresponding to the conductive elements 112 to enable each conductive element 112 to be aligned with a bond pad 104 of the plurality of bond pads 104. The substrate 102 may be any substrate to which a semiconductor die 110 may be physically and electrically connected. By way of example and not limitation, the substrate 102 may be a printed circuit board (PCB), an interposer, another semiconductor die (e.g., a memory die, a logic die), etc. Although the substrate 102 is shown as approximately covering the same area as the semiconductor die 110, the substrate 102 may have a relative size different than the semiconductor die 110. For example, the substrate 102 may be relatively larger than the semiconductor die 110 in some embodiments. The bond pads 104 of the substrate 102 may include any electrically conductive material or combination of materials, as will be recognized by one of ordinary skill in the art. For example, the bond pads 104 may include at least one of copper, nickel, platinum, gold, solder (e.g., SnAg), tin, silver, tungsten, indium, conductive epoxy, conductor-filled epoxy, etc.

A bonding head 190 may be used to compress the semiconductor die 110 with a force F against the substrate 102 such that each conductive element 112 physically contacts a corresponding bond pad 104. Due to the exposure of the conductive elements 112 through the surrounding underfill material 130, a physical interface between each conductive element 112 and corresponding bond pad 104 may be at least substantially free of the underfill material 130. Thus, the physical interface between the substrate 102 and the semiconductor die 110 may be characterized by a conductor-to-conductor, such as a metal-to-metal, connection. By way of example and not limitation, the force F may be between about 5 N and about 30 N. In some embodiments, the force F may be between about 10 N and about 20 N. However, one of ordinary skill in the art will recognize that the force F used to provide contact between the conductive elements 112 and the bond pads 104 may be dependent on several factors, such as the size of the semiconductor die 110, the number of conductive elements 112 on the semiconductor die 110, the viscosity of the underfill material 130, etc.

Referring to FIG. 19, after establishing physical contact between the conductive elements 112 of the semiconductor die 110 and the bond pads 104 of the substrate 102 with the force F, the underfill material 130 and at least a portion of the conductive elements 112 (e.g., a tip portion, such as the solder portion 118) may be at least partially melted by application of heat H. For example, heat may be applied to the bonding head 190 to heat the underfill material 130 to a first temperature sufficient to melt the underfill material 130, but insufficient to melt the solder portions 118. The underfill material 130 may, as a result, flow to fill (e.g., substantially fully fill) the gap between a substrate 111 of the semiconductor die 110 and the substrate 102 and between adjacent conductive elements 112 and bond pads 104. If the underfill material 130 includes a fluxing agent, the fluxing agent may clean oxides present at surfaces of the solder portions 118 exposed to the underfill material 130.

Additional heat may be applied to the bonding head 190 to heat the conductive elements 112 to a second, higher temperature sufficient to melt the solder portions 118. The melted solder portions 118 may wet the bond pads 104 to form an electrical interconnection with the bond pads 104. Through the heating to the first temperature and/or to the second temperature, the underfill material 130 may be at least substantially fully cured, such as to a so-called "C-stage," which occurs at a particular temperature dependent on the particular underfill material 130 used, as will be understood by one of ordinary skill in the art. The semiconductor die 110 and the substrate 102 may then be allowed to cool, such that the melted underfill material 130 and the melted solder portions 118 solidify to physically bond the semiconductor die 110 and the substrate 102 together. Optionally, the underfill material 130 may also be subjected to a post-cure operation, such as maintaining the underfill material 130 at an elevated (e.g., above ambient) temperature for a period of time, to improve chemical and/or mechanical properties of the underfill material 130. Thus, the electrical interconnection between the conductive elements 112 and the corresponding bond pads 104 of the substrate 102 may be at least substantially free of any underfill material 130 entrapped therebetween.

Although FIGS. 18 and 19 show the conductive elements 112 being aligned with and connected to bond pads 104, the present disclosure is not so limited. One of ordinary skill in the art will recognize that the conductive elements 112 may, in some embodiments, be aligned with and connected to other elements, such as leads or circuit lines, for example.

Figure 20:
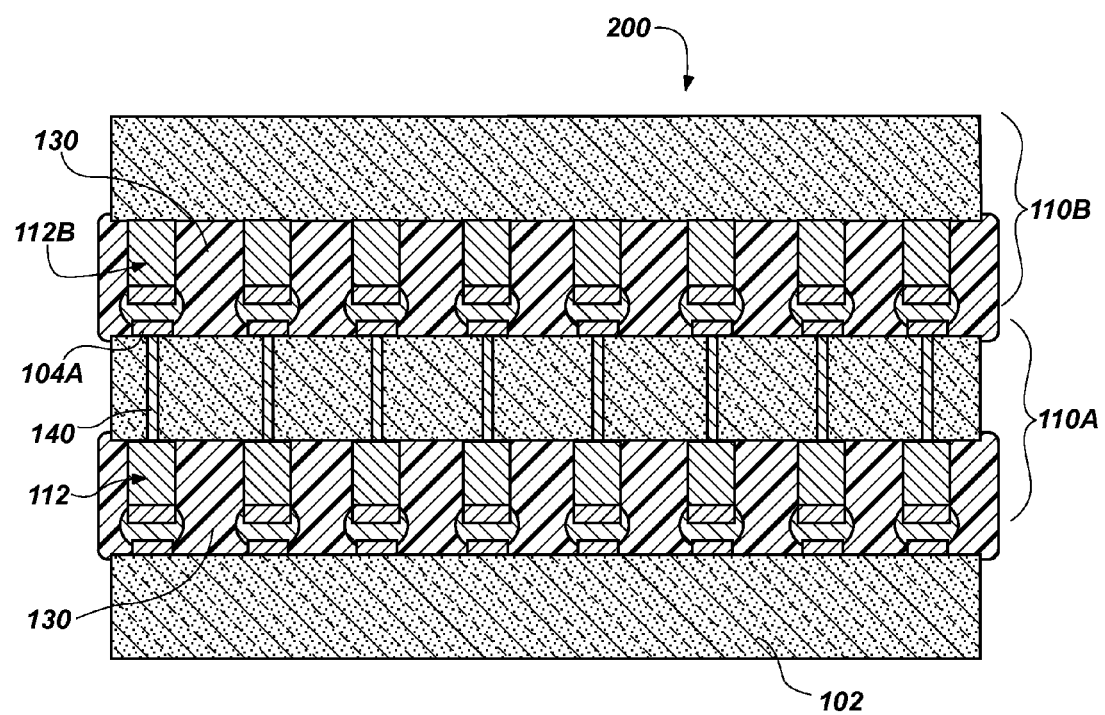
FIG. 20 shows a partial cross-sectional view of an embodiment of a semiconductor device package according to the present disclosure.

FIG. 20 shows a partial cross-sectional view of an embodiment of a semiconductor device package 200 according to the present disclosure. As shown in FIG. 20, the semiconductor device package 200 may include multiple semiconductor dice 110A and 110B, which may be formed by methods of the present disclosure, stacked, and attached to a substrate 102. The substrate 102 may be essentially the same as described above with reference to the substrate 102 of FIGS. 18 and 19. A first semiconductor die 110A may be attached to the substrate 102 in essentially the same manner as described above with reference to the semiconductor die 110 of FIGS. 18 and 19 being attached to the substrate 102. A second semiconductor die 110B may be attached to a side of the first semiconductor die 110A opposite the substrate 102 in a similar manner. For example, the first semiconductor die 110A may include a plurality of bond pads 104A on a side thereof opposite the plurality of conductive elements 112. In some embodiments, such as that shown in FIG. 20, the first semiconductor die 110A may include a via 140 between each conductive element 112 and a bond pad 104A opposing the conductive element 112. Thus, the first semiconductor die 110A may be a so-called "TSV" (through silicon via) die.

The first semiconductor die 110A may act as a substrate to which the second semiconductor die 110B may be attached, as described above with reference to FIGS. 18 and 19. Prior to attaching the second semiconductor die 110B to the first semiconductor die 110A, a plurality of conductive elements 112B may be formed on the second semiconductor die 110B that may include a surface that is exposed through the underfill material 130. The plurality of conductive elements 112B of the second semiconductor die 110B may be aligned with and brought into physical contact with the plurality of bond pads 104A on the first semiconductor die 110A. The underfill material 130 and at least a portion of each conductive element 112B may be heated and melted to at least a curing temperature of the underfill material 130, as described above.

Although the semiconductor device package 200 includes two semiconductor dice 110A and 110B attached to the substrate 102, the present disclosure is not so limited. For example, the semiconductor device package 200 may include one, two, three, four, eight, or any other number of semiconductor dice in a given application, as will be appreciated by one of ordinary skill in the art. The semiconductor dice of a given semiconductor device package may be of the same or different types. For example, multiple memory dice may be stacked on and operably coupled to a logic die. In some embodiments, the attachment operation described above may be repeated multiple times to form the semiconductor device package 200 to include a plurality of semiconductor dice.

Although the bonding operation used to form the semiconductor device package 200 including the plurality of semiconductor dice 110A, 110B has been described to include attaching each semiconductor die 110A or 110B one-at-a-time, the present disclosure is not so limited. For example, multiple semiconductor dice 110A, 110B may be positioned (e.g., stacked), over the substrate 102 and may be simultaneously heated to melt the respective underfill materials 130 and at least portions of the respective conductive elements 112, 112B. Thus, any number of semiconductor dice 110A, 110B may be simultaneously attached to the substrate 102, which may reduce the time and, therefore, expense required to form one or more semiconductor device packages 200. In addition, multiple, laterally spaced stacks of semiconductor dice may be formed on a substrate in the form of a semiconductor wafer comprising multiple dice, the stacked dice bonded to each other and to the wafer, and then the wafer singulated to form individual packages after, for example, encapsulation of the die stacks. The same technique may be applied to form die stacks on interposers or other substrates.

Although the present disclosure has been described with reference to the underfill material 130 being applied to the semiconductor dice 110 and removed from over the conductive elements 112 at the wafer level, one of ordinary skill in the art will understand that improvements over conventional methods may be realized when processing individual semiconductor dice 110. For example, underfill material 130 may be applied to individual semiconductor dice 110 and/or may be removed from over the conductive elements 112 after the semiconductor dice 110 have been singulated from the semiconductor wafer 150.

Embodiments of the present disclosure may be used to attach semiconductor dice 110 having a high pin-count and/or fine pitch conductive elements 112 to a substrate, while at least substantially eliminating electrical interconnections that suffer from defects of entrapped underfill material. Since a portion of the underfill material 130 is removed, the underfill material 130 is not required to flow off of the conductive elements 112 during the bonding operation. Thus, a broader selection of materials for the underfill material 130 may be used in comparison to conventional methods. Thus, in embodiments of the present disclosure, a material with a high viscosity and/or with a high weight percentage of filler may be used as the underfill material 130, in contrast to conventional methods where low-viscosity materials or materials having a low weight percentage of filler are used.

Embodiments of the present disclosure may save time and, therefore, cost when compared to methods in which underfill material is formed over individual semiconductor dice after singulation, and compared to methods in which underfill material is introduced between a semiconductor die and a substrate (e.g., CUF methods). Furthermore, yield and reliability of semiconductor device packages formed by embodiments of the methods of the present disclosure may be improved over conventional underfill methods, due to the lack of entrapped underfill material in the electrical interconnections of the present disclosure.

Accordingly, in one embodiment, the present disclosure includes a method for forming a semiconductor device package. The method may include applying an underfill material over a semiconductor wafer including conductive elements on a major surface thereof to an average thickness of the underfill material of at least about eighty percent (80%) of an average height of conductive elements and the underfill material covers at least a substantial number of the conductive elements. The method may also include removing underfill material covering tips of conductive elements without reducing the average thickness of the underfill material to less than about eighty percent (80%) of the average height of the conductive elements prior to application of the underfill material.

In another embodiment, the present disclosure includes another method for forming a semiconductor package. The method may include positioning a stencil over a semiconductor wafer including a plurality of semiconductor dice each including conductive elements formed thereon; and applying an underfill material to a major surface of the semiconductor wafer through the stencil, while avoiding substantial application of the underfill material to the conductive elements.

In yet another embodiment, the present disclosure includes another method for forming a semiconductor package, which may include applying an underfill material to a major surface of at least one semiconductor die and over tip portions of conductive elements on the major surface of the semiconductor die and removing a portion of the underfill material over the tip portions of the plurality of conductive elements to provide a surface of each tip portion of the conductive elements substantially free of the underfill material. The conductive elements of the at least one semiconductor die may be aligned with a bond pads of a substrate and the conductive elements and the aligned bond pads may be contacted. The method may also include heating the conductive elements and the underfill material to a first temperature sufficient to melt the underfill material but insufficient to melt the tip portions of the conductive elements, flowing the heated underfill material to at least substantially fully fill a gap between the at least one semiconductor die and the substrate, and heating the conductive elements and the underfill material to a second temperature sufficient to melt the solder portions.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure encompasses all modifications, combinations, equivalents, and alternatives falling within the scope of the invention as defined by the following appended claims and their legal equivalents.

What is claimed is:

1. A method for forming a semiconductor device package, the method comprising:
    applying an underfill material over a semiconductor wafer including conductive elements on a major surface thereof to an average thickness of the underfill material of at least about eighty percent (80%) of an average height of the conductive elements, wherein the underfill material covers at least a substantial number of the conductive elements;
    planarizing each of the conductive elements and forming an exposed planar surface of each of the conductive elements above planar surfaces of the underfill material between adjacent conductive elements without reducing the average thickness of the underfill material to less than about eighty percent (80%) of the average height of the conductive elements prior to application of the underfill material over the semiconductor wafer to remove underfill material covering tips of the conductive elements;

attaching conductive elements of at least one semiconductor die of the semiconductor wafer to bond pads of a substrate;
electrically connecting bond pads of the at least one semiconductor die on a side of the at least one semiconductor die opposite the conductive elements of the at least one semiconductor die with a conductive via; and
attaching conductive elements of another semiconductor die with the bond pads of the at least one semiconductor die.

2. The method of claim 1, further comprising forming the conductive elements of the semiconductor wafer on the major surface of the semiconductor wafer, each of the conductive elements comprising a solder portion on a tip thereof.

3. The method of claim 1, further comprising forming the conductive elements of the semiconductor wafer on the major surface of the semiconductor wafer, wherein forming the conductive elements comprises:
forming copper pillars;
forming a nickel cap over each copper pillar; and
forming a solder material over each nickel cap.

4. The method of claim 1, further comprising forming adjacent conductive elements at a pitch of about 50 μm or less.

5. The method of claim 1, wherein applying an underfill material over a semiconductor wafer comprises a process selected from the group consisting of laminating a sheet of underfill material and spin coating a flowable underfill material over the semiconductor wafer.

6. The method of claim 1, wherein applying an underfill material over a semiconductor wafer comprises coating the semiconductor wafer with the underfill material to an average thickness greater than the average height of the conductive elements.

7. The method of claim 1, wherein applying an underfill material over a semiconductor wafer comprises coating the semiconductor wafer with the underfill material to an average thickness less than the average height of the conductive elements.

8. The method of claim 1, wherein attaching conductive elements of at least one semiconductor die of the semiconductor wafer to bond pads of a substrate comprises:
aligning the conductive elements of the at least one semiconductor die of the semiconductor wafer with the bond pads of the substrate;
compressing the at least one semiconductor die against the substrate to contact the conductive elements of the at least one semiconductor die with respectively associated bond pads of the substrate; and
heating the conductive elements of the at least one semiconductor die and the underfill material to attach the conductive elements of the at least one semiconductor die to the associated bond pads of the substrate and the at least one semiconductor die to the substrate.

9. The method of claim 8, wherein heating the conductive elements of the at least one semiconductor die and the underfill material to attach the conductive elements of the at least one semiconductor die to the associated bond pads of the substrate and the at least one semiconductor die to the substrate comprises:
heating the conductive elements and the underfill material to a first temperature sufficient to melt the underfill material and cause the underfill material to flow to substantially fully fill a gap between the at least one semiconductor die and the substrate but insufficient to cause tip portions of the conductive elements to bond with the bond pads;
heating the conductive elements and the underfill material to a second, higher temperature sufficient to melt the tip portions; and
cooling the at least one semiconductor die and the substrate to below the first temperature.

10. The method of claim 8, wherein heating the conductive elements of the at least one semiconductor die and the underfill material comprises flowing the underfill material and tip portions of the conductive elements.

11. The method of claim 8, wherein compressing the at least one semiconductor die against the substrate to contact the conductive elements of the at least one semiconductor die with respectively associated bond pads of the substrate comprises forming a physical interface between the conductive elements and the respectively associated bond pads substantially free of the underfill material.

12. The method of claim 1, wherein attaching conductive elements of another semiconductor die with the bond pads of the at least one semiconductor die comprises:
aligning the conductive elements of the another semiconductor die of the semiconductor wafer with the bond pads of the at least one semiconductor die;
compressing the another semiconductor die against the at least one semiconductor die to contact the conductive elements of the another semiconductor die with respectively associated bond pads of the at least one semiconductor die; and
heating the conductive elements of the another semiconductor die and the underfill material to attach the conductive elements of the another semiconductor die to the respectively associated bond pads of the at least one semiconductor die and the at least another semiconductor die to the at least one semiconductor die.

13. The method of claim 12, wherein heating the conductive elements of the another semiconductor die and the underfill material to attach the conductive elements of the another semiconductor die to the respectively associated bond pads of the at least one semiconductor die and the at least another semiconductor die to the at least one semiconductor die further comprises simultaneously heating the conductive elements of the another semiconductor die and the underfill material to attach the conductive elements of the another semiconductor die to the associated bond pads of the at least one semiconductor die and the at least another semiconductor die to the at least one semiconductor die and heating the conductive elements of the at least one semiconductor die and the underfill material to attach the conductive elements of the at least one semiconductor die to the associated bond pads of the substrate and the at least one semiconductor die to the substrate.

14. The method of claim 1, wherein applying an underfill material over a semiconductor wafer including conductive elements on a major surface thereof comprises applying a vacuum to an area between a sheet of the underfill material and the semiconductor wafer and pressing the sheet of the underfill material against the semiconductor wafer.

15. A method for forming a semiconductor device package, the method comprising:
applying an underfill material over a semiconductor wafer including conductive elements to an average thickness that is between about ninety percent (90%) and about ninety-five percent (95%) of an average height of the conductive elements;
removing the underfill material covering tips of the conductive elements; and
planarizing each of the conductive elements to form an exposed planar surface of each of the conductive elements above planar surfaces of the underfill material between adjacent conductive elements while an average thickness of the underfill material between conductive elements remains less than the average height of the conductive elements.

16. The method of claim 15, wherein removing the underfill material covering tips of conductive elements comprises:
positioning a mask over the semiconductor wafer to respectively align apertures in the mask with the conductive elements; and
directing plasma through the apertures in the mask to remove the underfill material over the tips of the conductive elements.

17. The method of claim 15, wherein removing the underfill material covering tips of conductive elements comprises subjecting the underfill material covering the tips of the conductive elements to a planarization operation.

18. The method of claim 15, further comprising at least partially curing the underfill material after applying the underfill material over the semiconductor wafer.

19. The method of claim 15, wherein removing the underfill material covering tips of the conductive elements comprises directing a plasma comprising at least one of argon, oxygen, nitrogen, hydrogen, and tetrafluorocarbon to exposed portions of the underfill material.

20. The method of claim 15, wherein applying an underfill material over a semiconductor wafer comprises laminating a sheet of underfill material onto the semiconductor wafer.

* * * * *